United States Patent
Morita (10) Patent No.: US 9,991,086 B2
(45) Date of Patent: Jun. 5, 2018

(54) MULTI CHARGED PARTICLE BEAM WRITING METHOD AND MULTI CHARGED PARTICLE BEAM WRITING APPARATUS

(71) Applicant: NuFlare Technology, Inc., Yokohama-shi (JP)

(72) Inventor: Hirofumi Morita, Setagaya-ku (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days. days.

(21) Appl. No.: 15/273,900

(22) Filed: Sep. 23, 2016

(65) Prior Publication Data
US 2017/0207056 A1 Jul. 20, 2017

(30) Foreign Application Priority Data
Jan. 14, 2016 (JP) .................................. 2016-005455

(51) Int. Cl.
*H01J 37/04* (2006.01)
*H01J 37/14* (2006.01)
*H01J 37/317* (2006.01)

(52) U.S. Cl.
CPC ............ *H01J 37/045* (2013.01); *H01J 37/14* (2013.01); *H01J 37/3177* (2013.01); *H01J 2237/0435* (2013.01)

(58) Field of Classification Search
USPC ................................. 250/492.3, 492.2, 396 R
See application file for complete search history.

(56) References Cited

U.S. PATENT DOCUMENTS

| | | | | |
|---|---|---|---|---|
| 4,434,371 A | * | 2/1984 | Knauer | H01J 37/045 250/396 R |
| 5,155,368 A | * | 10/1992 | Edwards, Jr. | H01J 37/045 250/396 R |

(Continued)

FOREIGN PATENT DOCUMENTS

| | | |
|---|---|---|
| JP | 2005-50888 A | 2/2005 |
| JP | 2007-534121 A | 11/2007 |

(Continued)

OTHER PUBLICATIONS

Office Action dated Nov. 8, 2017 in Taiwanese Patent Application No. 105142115 (English translation of categories of cited documents).

(Continued)

*Primary Examiner* — Phillip A Johnston
(74) *Attorney, Agent, or Firm* — Oblon, McClelland, Maier & Neustadt, L.L.P.

(57) ABSTRACT

In one embodiment, a multi charged particle beam writing method includes performing blanking deflection on each of multiple beams using a plurality of individual blankers, and collectively performing blanking deflection on the multiple beams using a common blanker. The beams controlled in the beam ON state by the individual blankers and the common blanker pass through a hole at central part of a liming aperture member. The beams deflected in the beam OFF state by the individual blankers or the common blanker are deviated from the hole and are interrupted by the limiting aperture member. When one of the common blanker and the individual blanker deflects one of the beams to the beam OFF state while the other of them deflects the beam in the beam OFF state, the beam moves on the limiting aperture member such that the beam is away from the hole.

11 Claims, 4 Drawing Sheets

(56) References Cited

U.S. PATENT DOCUMENTS

| | | | |
|---|---|---|---|
| 6,556,702 B1 | 4/2003 | Rishton et al. | |
| 7,781,748 B2 | 8/2010 | Platzgummer | |
| 8,969,837 B2* | 3/2015 | Matsumoto | H01J 37/3177 |
| | | | 250/396 R |
| 9,543,120 B2* | 1/2017 | Matsumoto | H01J 37/045 |
| 2013/0253688 A1* | 9/2013 | Matsumoto | H01L 21/02675 |
| | | | 700/121 |
| 2014/0231668 A1 | 8/2014 | Yasuda | |
| 2015/0243480 A1 | 8/2015 | Yamada | |
| 2017/0169993 A1* | 6/2017 | Iizuka | H01J 37/3005 |

FOREIGN PATENT DOCUMENTS

| | | |
|---|---|---|
| JP | 2009-532887 | 9/2009 |
| JP | 2010-232204 | 10/2010 |
| JP | 2013-197469 | 9/2013 |
| JP | 2014-112639 | 6/2014 |
| KR | 10-2014-0057175 A | 5/2014 |

OTHER PUBLICATIONS

Korean Office Action dated Nov. 22, 2017 in Patent Application No. 10-2016-0182266.

* cited by examiner

DEFLECTION BY
INDIVIDUAL BLANKER

FIG. 5B

DEFLECTION BY
COMMON BLANKER

MULTI CHARGED PARTICLE BEAM WRITING METHOD AND MULTI CHARGED PARTICLE BEAM WRITING APPARATUS

CROSS REFERENCE TO RELATED APPLICATION

This application is based upon and claims benefit of priority from the Japanese Patent Application No. 2016-5455, filed on Jan. 14, 2016, the entire contents of which are incorporated herein by reference.

FIELD

The present invention relates to a multi charged particle beam writing method and a multi charged particle beam writing apparatus.

BACKGROUND

As LSI circuits are increasing in density, the line width of circuits of semiconductor devices is becoming finer. Examples of methods of producing an exposure mask (also called a reticle that is used in a stepper or a scanner) to be used to form a circuit pattern for such a semiconductor device include an electron beam writing technique with high resolution.

A writing apparatus using multiple beams enables irradiation with many beams at a time (in a single shot) as compared with writing with a single electron beam, and thus markedly increases throughput. In such a multi-beam writing apparatus, for example, an electron beam emitted downwardly from an electron gun passes through an aperture member having a plurality of holes, thus forming multiple beams.

Under the aperture member, a blanking plate is disposed which has passage holes aligned with the holes arranged in the aperture member. Each of the passage holes of the blanking plate is provided with an individual blanker (individual blanking deflector) that performs blanking deflection on the corresponding beam.

Under the blanking plate, a common blanker (common blanking deflector) is disposed which collectively performs blanking control on the multiple beams. Under the common blanker, a limiting aperture member having a hole at its central part is disposed. The electron beams deflected in a beam OFF state by the individual blankers or the common blanker are deviated from the central hole of the limiting aperture member, so that the beams are interrupted by the limiting aperture member. The electron beams that are not deflected by the individual blankers and the common blanker pass through the limiting aperture member. The passed beams are deflected by a deflector and are applied at intended positions on a substrate.

In a configuration in which a beam deflection direction of the individual blankers is opposite to a beam deflection direction of the common blanker, when one of the common blanker and the individual blanker deflects the beam to the beam OFF state while the other of the common blanker and the individual blanker deflects the beam in the beam OFF state, the beam passes through the hole of the limiting aperture member, causing the leakage of the beam. This results in insufficient control of the amount of beams applied to a substrate. This leads to a reduction in writing accuracy.

DETAILED DESCRIPTION

In one embodiment, a multi charged particle beam writing method includes performing blanking deflection on each of multiple beams using a plurality of individual blankers to individually perform beam ON/OFF control on a corresponding beam, and collectively performing blanking deflection on the multiple beams using a common blanker to switch the beams between a beam ON state and a beam OFF state. The beams controlled in the beam ON state by the individual blankers and the common blanker pass through a hole at central part of a liming aperture member and are applied to a substrate. The beams deflected in the beam OFF state by the individual blankers or the common blanker are deviated from the hole and are interrupted by the limiting aperture member. When one of the common blanker and the individual blanker deflects one of the beams to the beam OFF state while the other of them deflects the beam in the beam OFF state, the beam moves on the limiting aperture member such that the beam is away from the hole.

Embodiments of the present invention will be described with reference to the drawings.

First Embodiment

Figure 1:
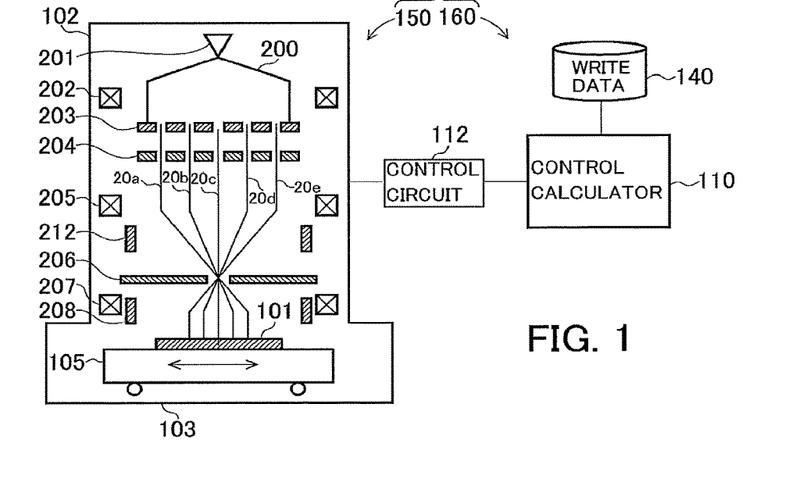
FIG. 1 is a schematic diagram illustrating a configuration of a writing apparatus according to a first embodiment.

FIG. 1 is a schematic diagram illustrating the configuration of a writing apparatus according to a first embodiment. A writing apparatus 100, serving as an example of a multi charged particle beam writing apparatus, includes a writing unit 150 and a control unit 160.

The writing unit 150 includes an electron optical column 102 and a writing chamber 103. The electron optical column 102 accommodates an electron gun 201, an illumination lens 202, an aperture member 203, a blanking plate 204, a projection lens 205, a deflector 212, a limiting aperture member 206, an objective lens 207, and a deflector 208.

Each of the illumination lens 202, the projection lens 205, and the objective lens 207 is an electrostatic lens.

The writing chamber 103 accommodates an XY stage 105. A mask substrate 101, serving as a writing target, is mounted on the XY stage 105. Examples of the mask substrate 101 include an exposure mask used to fabricate a semiconductor device and a semiconductor substrate (silicon wafer) on which semiconductor devices are to be fabricated. In addition, examples of the mask substrate 101 include mask blanks that are coated with resist and that have not yet been subjected to writing.

The control unit 160 includes a control calculator 110, a control circuit 112, and a storage device 140, such as a magnetic disk unit. Write data from an external device is input to and stored in the storage device 140 (storage unit).

Figure 2A:
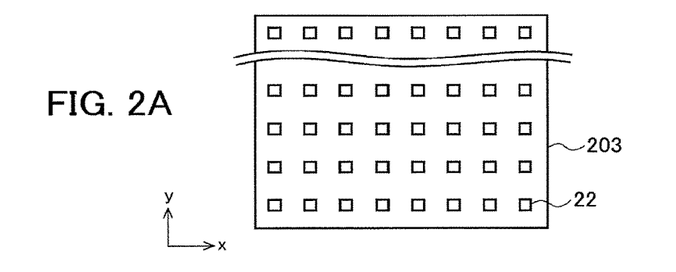
FIGS. 2A and 2B are schematic diagrams each illustrating a configuration of an aperture member.
Figure 2B:
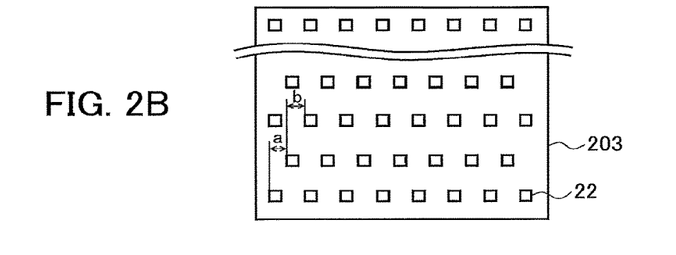

FIGS. 2A and 2B are schematic diagrams each illustrating the configuration of the aperture member 203. Referring to FIG. 2A, the aperture member 203 has holes (apertures) 22 arranged in a matrix of m columns extending in a longitudinal direction (y direction) of the member×n rows extending in a lateral direction (x direction) thereof (m, n≥2) at a predetermined pitch. For example, the aperture member 203 has the holes 22 arranged in a matrix of 8 columns×512 rows. The holes 22 are rectangular and have the same shape and dimensions. The holes 22 may be circular and have the same outside diameter. An electron beam 200 partially passes through these holes 22, thus forming multiple beams 20.

In the above-described arrangement of the holes 22, both the number of columns in the longitudinal direction (y direction) and the number of rows in the lateral direction (x direction) are two or more. The arrangement is not limited to this example. For example, one of the number of columns in the longitudinal direction (y direction) and the number of rows in the lateral direction (x direction) may be two or more and the other of the number of columns and the number of rows may be one. In addition, the arrangement of the holes 22 is not limited to the matrix as illustrated in FIG. 2A. As illustrated in FIG. 2B, the position of each hole in the second row is shifted from the position of each hole in the first row by a dimension "a" in the lateral direction (x direction). Similarly, the position of each hole in the third row is shifted from the position of each hole in the second row by a dimension "b" in the lateral direction (x direction).

Figure 3:
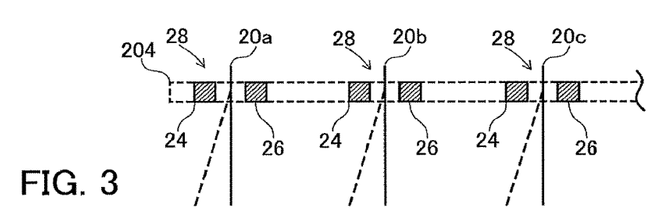
FIG. 3 is a schematic diagram illustrating the configuration of a blanking plate.

FIG. 3 is a schematic diagram illustrating the configuration of the blanking plate 204. The blanking plate 204 has the passage holes aligned with the holes 22 of the aperture member 203. Each of the passage holes is provided with two electrodes 24 and 26 paired (a blanker 28: a blanking deflector). The control circuit 112 applies voltage to one of the two electrodes 24 and 26 (for example, the electrode 24) for an individual beam. The other of the two electrodes 24 and 26 (for example, the electrode 26) is grounded.

Each of electron beams 20a to 20e passing through the passage holes can be independently deflected by voltage applied to the two electrodes 24 and 26. Such deflection achieves blanking control. Each of the blankers 28 performs blanking deflection on a corresponding one of the multiple beams passed through the holes 22 (apertures) of the aperture member 203. Hereinafter, the two electrodes 24 and 26 paired for an individual beam will be referred to as an individual blanker 28.

The deflector 212 collectively performs blanking control on the multiple beams. Hereinafter, the deflector 212 will be referred to as a common blanker 212.

Figure 4A:
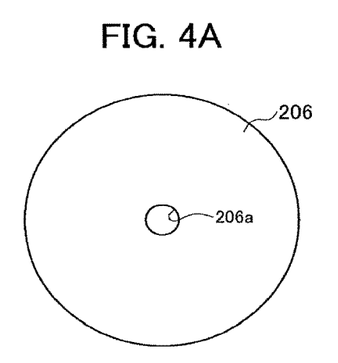
FIG. 4A is a top plan view of a limiting aperture member and FIG. 4B is a diagram illustrating beam deflection directions of blankers on the limiting aperture member.

FIG. 4A is a top plan view of the limiting aperture member 206. As illustrated in FIG. 4A, the limiting aperture member 206 has a hole 206a at its central part. The electron beams 20 that are not deflected (or that are controlled in a beam ON state) by the individual blankers 28 and the common blanker 212 pass through the hole 206a. On the other hand, the electron beams 20 that are deflected (or controlled in a beam OFF state) by the individual blankers 28 and/or the common blanker 212 are deviated from the hole 206a, so that the beams are interrupted by the limiting aperture member 206.

According to the present embodiment, as described above, the group of individual blankers 28 and the common blanker 212 perform blanking control to control the beam ON/OFF state. The beams passing through the limiting aperture member 206 for a period between the time when the beam ON state is provided and the time when the beam OFF state is provided correspond to a single shot of beam irradiation. The multiple beams passed through the limiting aperture member 206 are focused by the objective lens 207, thus forming a pattern image. The beams are applied at beam irradiation positions on the mask substrate 101.

The writing apparatus 100 performs a writing operation in such a raster scanning manner that beam shots are successively and sequentially applied while the XY stage 105 is moved. To write an intended pattern, beams necessary for the pattern are controlled to the beam ON state by blanking control.

According to the present embodiment, the blanking plate 204 and the common blanker 212 are set in (or attached to) the writing unit 150 such that a direction in which the individual blankers 28 deflect beams to the beam OFF state is identical to a direction in which the common blanker 212 deflects beams to the beam OFF state.

The projection lens 205 disposed between the blanking plate 204 and the common blanker 212 is an electrostatic lens, which does not cause beams to be rotated between the blanking plate 204 and the common blanker 212 and does not cause a formed image to be inverted between the blanking plate 204 and the common blanker 212.

Figure 4B:
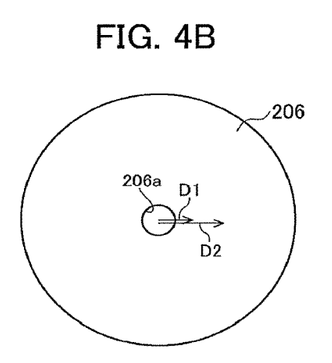

With such a configuration, as illustrated in FIG. 4B, a direction D1 in which beams move (or are deflected) on the limiting aperture member 206 when the individual blankers 28 deflect the beams to the beam OFF state is identical to a direction D2 in which beams move (or are deflected) on the limiting aperture member 206 when the common blanker 212 deflects the beams to the beam OFF state.

As described above, the beam deflection direction D1 for the beam OFF state of the group of individual blankers 28 is made identical to the beam deflection direction D2 for the beam OFF state of the common blanker 212 on the limiting aperture member 206. This can prevent the beams from leaking from the hole 206a when one of the common blanker 212 and the group of individual blankers 28 deflects beams to the beam OFF state while the other of the common blanker 212 and the group of individual blankers 28 deflects the beams in the beam OFF state.

Figure 5A:
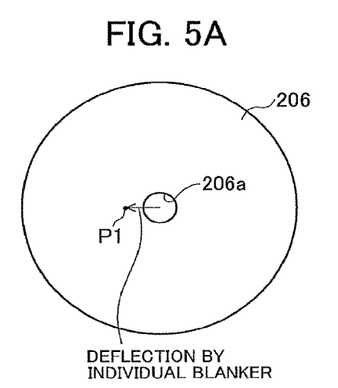
FIGS. 5A and 5B are diagrams illustrating a beam deflection direction of individual blankers and a beam deflection direction of a common blanker on a limiting aperture member in a comparative example.
Figure 5B:
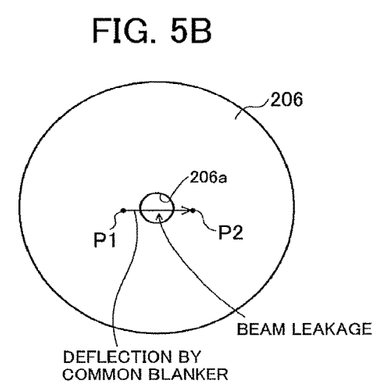

FIGS. 5A and 5B illustrate beam deflection by individual blankers and beam deflection by a common blanker in a comparative example. In this example, the beam deflection direction of the individual blankers is opposite to that of the common blanker. When the common blanker deflects beams to the beam OFF state while the individual blankers deflect the beams in the beam OFF state as illustrated in FIG. 5A, the beams pass through the hole 206a while moving from a position P1 to a position P2 on the limiting aperture member 206 as illustrated in FIG. 5B, so that the beams leak from the hole 206a. The beams passed through, or leaked from the hole 206a are applied to the mask substrate 101, resulting in a reduction in pattern writing accuracy.

In contrast, according to the present embodiment, the beam deflection direction D1 for the beam OFF state of the individual blankers 28 is identical to the beam deflection direction D2 for the beam OFF state of the common blanker 212. This eliminates or reduces the leakage of beams from the hole 206a, thus preventing a reduction in writing accuracy.

The control calculator 110 of the control unit 160 reads write data from the storage device 140 and subjects the data to multi-stage data conversion to generate shot data. The shot data contains defined information indicating, for example, the presence or absence of irradiation for each irradiation area on the mask substrate 101 and irradiation time. The irradiation areas are obtained by dividing a writing surface of the mask substrate 101 into beam-sized areas in a lattice pattern. The control calculator 110 outputs a control signal to the control circuit 112 based on the shot data. The control circuit 112 controls the writing unit 150 based on the control signal. For example, the control circuit 112 controls voltage applied to, for example, the electrodes of the individual blankers 28 and the common blanker 212 and the electrostatic lenses, and controls the movement of the XY stage 105. The writing unit 150 operates as follows.

The illumination lens 202 allows the electron beam 200 emitted from the electron gun 201 (emitting unit) to be applied substantially perpendicular to the entirety of the aperture member 203. The electron beam 200 is applied to an area including all of the holes 22 of the aperture member 203. The electron beam 200 passes through the holes 22, thus forming multiple electron beams (multiple beams) 20a to 20e having a rectangular shape in cross-section, for example.

Each of the multiple beams 20a to 20e passes through the corresponding one of the individual blankers 28 of the blanking plate 204. Each of the individual blankers 28 individually deflects (or performs blanking deflection on) the passing electron beam 20. The multiple beams 20a to 20e passed through the blanking plate 204 are converged by the projection lens 205. The resultant beams pass through the common blanker 212 and travel toward the central hole 206a of the limiting aperture member 206.

The electron beams 20 deflected by the individual blankers 28 of the blanking plate 204 are deviated from the central hole 206a of the limiting aperture member 206 and are thus interrupted by the limiting aperture member 206. On the other hand, the electron beams 20 that have not been deflected by the individual blankers 28 pass through the central hole 206a of the limiting aperture member 206. Furthermore, the multiple beams collectively deflected by the common blanker 212 are deviated from the central hole 206a of the limiting aperture member 206 and are thus interrupted by the limiting aperture member 206.

Such an ON/OFF state of the blankers achieves blanking control, thus controlling the beam ON/OFF state. The multiple beams 20 passed through the limiting aperture member 206 are focused by the objective lens 207, thus forming a pattern image. The beams are deflected by the deflector 208 and are then applied at beam irradiation positions on the mask substrate 101.

The beam deflection direction for the beam OFF state of the group of individual blankers 28 coincides with the beam deflection direction for the beam OFF state of the common blanker 212. This eliminates or reduces a likelihood that, when one of the common blanker 212 and the group of individual blankers 28 deflects beams to the beam OFF state while the other of them deflects the beams in the beam OFF state, the deflected beams may pass through, or leak from the central hole 206a of the limiting aperture member 206. This can prevent a reduction in writing accuracy.

Second Embodiment

Although the illumination lens 202, the projection lens 205, and the objective lens 207 are the electrostatic lenses in the configuration according to the above-described first embodiment, the electron lenses used are not limited to electrostatic lenses. Magnetic lenses may be used.

Electrons exhibit helical motion in a magnetic field generated by a magnetic lens, so that an image rotates. If the illumination lens 202, the projection lens 205, and the objective lens 207 are magnetic lenses, a rotation angle φ of an image can be calculated in advance based on the intensity of the magnetic field generated by the projection lens 205.

Figure 6:
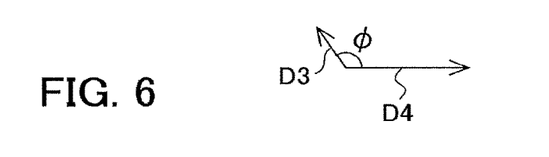
FIG. 6 is a conceptual diagram of a beam deflection direction of individual blankers and a beam deflection direction of a common blanker as viewed from above an apparatus according to a second embodiment.

The blanking plate 204 and the common blanker 212 are set in the writing unit 150 such that, as illustrated in FIG. 6, a direction D3 in which the individual blankers 28 deflect beams to the beam OFF state forms the angle φ with a direction D4 in which the common blanker 212 deflects beams to the beam OFF state. FIG. 6 is a conceptual diagram of the beam deflection direction of the individual blankers 28 and the beam deflection direction of the common blanker 212 as viewed from above a writing apparatus (the electron optical column 102).

Image rotation by the projection lens 205 allows the direction D1 in which beams move (or are deflected) on the limiting aperture member 206 when the individual blankers 28 deflect the beams to the beam OFF state to be identical to the direction D2 in which beams move (or are deflected) on the limiting aperture member 206 when the common blanker 212 deflects the beams to the beam OFF state, as in the above-described first embodiment (refer to FIG. 4B).

This eliminates or reduces the leakage of beams from the hole 206a of the limiting aperture member 206, thus preventing a reduction in writing accuracy.

Third Embodiment

Figure 7:
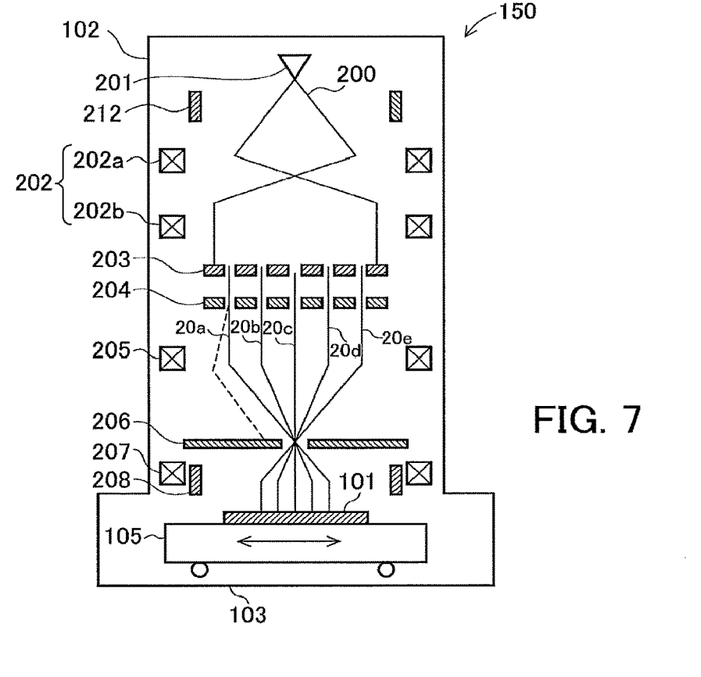
FIG. 7 is a schematic diagram illustrating the configuration of a writing apparatus according to a third embodiment.

Although the common blanker 212 is disposed under the projection lens 205 in the writing unit 150 in the foregoing first embodiment, the common blanker 212 may be disposed above the illumination lens 202 as illustrated in FIG. 7. Furthermore, the illumination lens 202 may include two components, or illumination lenses 202a and 202b.

Figure 8:
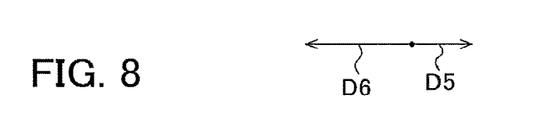
FIG. 8 is a conceptual diagram of a beam deflection direction of individual blankers and a beam deflection direction of a common blanker as viewed from above the apparatus according to the third embodiment.

In such a configuration illustrated in FIG. 7, an image is inverted in image formation by the illumination lens 202a. The blanking plate 204 and the common blanker 212 are accordingly set in the writing unit 150 such that, as illustrated in FIG. 8, a direction D5 in which the individual blankers 28 deflect beams to the beam OFF state is opposite to a direction D6 in which the common blanker 212 deflects beams to the beam OFF state.

Image inversion in the image formation by the illumination lens 202a allows the direction D1 in which beams move (or are deflected) on the limiting aperture member 206 when the individual blankers 28 deflect the beams to the beam OFF state to be identical to the direction D2 in which beams move (or are deflected) on the limiting aperture member 206 when the common blanker 212 deflects the beams to the beam OFF state, as in the foregoing first embodiment (refer to FIG. 4B).

This eliminates or reduces the leakage of beams from the hole 206a of the limiting aperture member 206, thus preventing a reduction in writing accuracy.

Fourth Embodiment

In the configuration according to the above-described third embodiment, the illumination lenses 202a and 202b, the projection lens 205, and the objective lens 207 may be magnetic lenses.

Since electrons exhibit helical motion in a magnetic field generated by a magnetic lens, an image rotates. If the illumination lenses 202, the projection lens 205, and the objective lens 207 are magnetic lenses, a rotation angle γ of an image can be calculated in advance based on the intensity of the magnetic field generated by each of the illumination lenses 202a and 202b.

Figure 9:
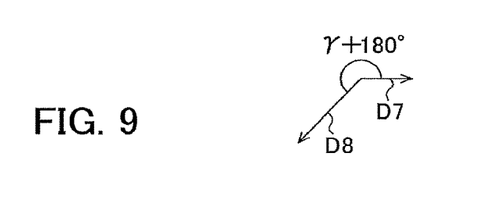
FIG. 9 is a conceptual diagram of a beam deflection direction of individual blankers and a beam deflection direction of a common blanker as viewed from above an apparatus according to a fourth embodiment.

The blanking plate 204 and the common blanker 212 are set in the writing unit 150 such that, as illustrated in FIG. 9, a direction D7 in which the individual blankers 28 deflect beams to the beam OFF state forms the angle γ+180° with a direction D8 in which the common blanker 212 deflects beams to the beam OFF state. The angle γ is a value obtained in consideration of image rotation by the illumination lenses 202a and 202b and 180° is a value obtained in consideration of image inversion in image formation by the illumination lens 202a.

Image rotation by the illumination lenses 202a and 202b and image inversion in image formation by the illumination lens 202a allow the direction D1 in which beams move (or are deflected) on the limiting aperture member 206 when the individual blankers 28 deflect the beams to the beam OFF state to be identical to the direction D2 in which beams move (or are deflected) on the limiting aperture member 206 when the common blanker 212 deflects the beams to the beam OFF state.

This eliminates or reduces the leakage of beams from the hole 206a of the limiting aperture member 206, thus preventing a reduction in writing accuracy.

Figure 10A:
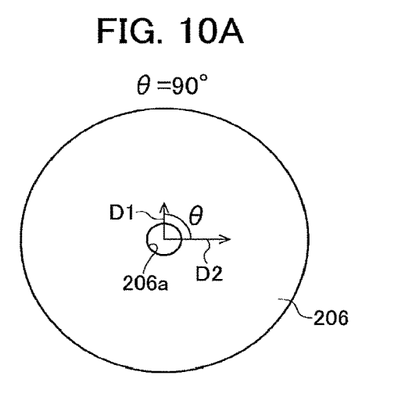
FIGS. 10A and 10B are diagrams each illustrating a beam deflection direction of individual blankers and a beam deflection direction of a common blanker on a limiting aperture member in a modification.
Figure 10B:
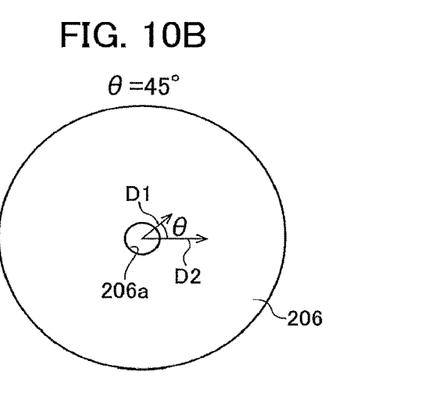

In the above-described first to fourth embodiments, the beam deflection direction D1 for the beam OFF state of the group of individual blankers 28 is made identical to the beam deflection direction D2 for the beam OFF state of the common blanker 212 on the limiting aperture member 206. When one of the common blanker 212 and the group of individual blankers 28 deflects beams to the beam OFF state while the other of them deflects the beams in the beam OFF state, the beams interrupted by the limiting aperture member 206 have only to be away from the hole 206a. As illustrated in FIGS. 10A and 10B, therefore, an angle θ formed by the directions D1 and D2 has only to be less than or equal to 90°. FIG. 10A illustrates a case where θ=90° and FIG. 10B illustrates a case where θ=45°. The angle θ is preferably less than or equal to 45°, more preferably less than or equal to 10° so that the direction D1 substantially coincides with the direction D2.

Although a two-stage blanking mechanism including the group of individual blankers 28 and the common blanker 212 is provided in the above-described embodiments, the blanking mechanism may include three or more stages. The beam deflection directions of the respective stages of the blanking mechanism are made identical to one another on the limiting aperture member 206. This eliminates or reduces the leakage of beams from the hole 206a of the limiting aperture member 206, thus preventing a reduction in writing accuracy.

In the foregoing embodiments, the configuration using an electron beam as an example of charged particle beams has been described. The charged particle beams are not limited to electron beams but may include ion beams.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing method comprising:
    performing blanking deflection on each of multiple beams using a plurality of individual blankers to individually perform beam ON/OFF control on a corresponding beam; and
    collectively performing blanking deflection on the multiple beams using a common blanker to switch the beams between a beam ON state and a beam OFF state,
    wherein the beams controlled in the beam ON state by the individual blankers and the common blanker pass through a hole at central part of a liming aperture member and are applied to a substrate,
    wherein the beams deflected in the beam OFF state by the individual blankers or the common blanker are deviated from the hole and are interrupted by the limiting aperture member, and
    wherein when one of the common blanker and the individual blanker deflects one of the beams to the beam OFF state while the other of them deflects the beam in the beam OFF state, the beam moves on the limiting aperture member such that the beam is away from the hole.

2. The method according to claim 1, wherein the individual blankers deflect the beams in a beam deflection direction that forms an angle of 90° or less on the limiting aperture member with a beam deflection direction in which the common blanker deflects the beams.

3. The method according to claim 2, wherein the beam deflection direction of the individual blankers is identical to the beam deflection direction of the common blanker on the limiting aperture member.

4. The method according to claim 1, wherein the beams are rotated by a magnetic lens disposed between the individual blankers and the common blanker.

5. The method according to claim 4, wherein the individual blankers deflect the beams to the beam OFF state in a direction that forms an angle with a direction in which the common blanker deflects the beams to the beam OFF state, and the formed angle depends on an angle of rotation of the beams caused by the magnetic lens.

6. A multi charged particle beam writing apparatus comprising:
    a plurality of individual blankers to individually perform beam ON/OFF control on a corresponding one of multiple charged particle beams;
    a common blanker to collectively perform beam ON/OFF control on the multiple beams; and
    a limiting aperture member having a hole at its central part, the limiting aperture member allowing the beams controlled in a beam ON state by the individual blankers and the common blanker to pass through the hole and be applied to a substrate, the limiting aperture member interrupting the beams deflected in a beam OFF state by the individual blankers or the common blanker and deviated from the hole, wherein while one of the common blanker and the individual blanker deflects one of the beams in the beam OFF state, the other of them deflects the beam interrupted by the limiting aperture member to the beam OFF state such that the beam is away from the hole.

7. The apparatus according to claim 6, wherein the individual blankers deflect the beams in a beam deflection direction that forms an angle of 90° or less on the limiting aperture member with a beam deflection direction in which the common blanker deflects the beams.

8. The apparatus according to claim 7, wherein the beam deflection direction of the individual blankers is identical to the beam deflection direction of the common blanker on the limiting aperture member.

9. The apparatus according to claim 6, further comprising:
a magnetic lens disposed between the group of individual blankers and the common blanker, the magnetic lens causing the beams to be rotated.

10. The apparatus according to claim 9, wherein the individual blanker deflects the beam to the beam OFF state in a direction that forms an angle with a direction in which the common blanker deflects the beam to the beam OFF state, and the formed angle depends on an angle of rotation of the beams caused by the magnetic lens.

11. The apparatus according to claim 6, wherein the common blanker is disposed above the individual blankers.

\* \* \* \* \*